United States Patent
Nakagawa (10) Patent No.: US 7,892,866 B2
(45) Date of Patent: Feb. 22, 2011

(54) METHOD OF MANUFACTURING SEMICONDUCTOR LASER USING END-FACE-PROCESSING JIG

(75) Inventor: Yasuyuki Nakagawa, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 56 days.

(21) Appl. No.: 12/346,938

(22) Filed: Dec. 31, 2008

(65) Prior Publication Data

US 2009/0181479 A1 Jul. 16, 2009

(30) Foreign Application Priority Data

Jan. 10, 2008 (JP) ............... 2008-002789

(51) Int. Cl.
*H01L 21/00* (2006.01)

(52) U.S. Cl. .............. 438/22; 438/29; 438/38; 257/E21.599

(58) Field of Classification Search .......... 438/22, 438/26, 29, 33, 38; 257/E21.599
See application file for complete search history.

(56) References Cited

U.S. PATENT DOCUMENTS 6,703,254 B2 * 3/2004 Saitoh et al. ............... 438/29
6,756,322 B2 * 6/2004 Ohta ........................ 438/779

FOREIGN PATENT DOCUMENTS

| JP | 60-140779 A | 7/1985 |
| JP | 9-083072 A | 3/1997 |
| JP | 11-317565 | * 11/1999 |
| JP | 2000-196180 | * 7/2000 |
| JP | 2000-196180 A | 7/2000 |

* cited by examiner

*Primary Examiner*—Michael Trinh
(74) *Attorney, Agent, or Firm*—Leydig, Voit & Mayer, Ltd.

(57) ABSTRACT

The invention provides an end-face-processing jig that allows the formation of a reflectance control film on an end face of a semiconductor laser body while preventing possible degradation due to catastrophic optical damage (COD) of a semiconductor laser, and a method of manufacturing a semiconductor laser employing such an end-face-processing jig. A window part of the end-face-processing jig is made of at least one of an oxide and a nitride, and semiconductor laser bars are fixed by the end-face-processing jig so that their end faces are exposed through a window of the window part. In this condition, a reflectance control film is formed on the end faces of the semiconductor laser bars for the manufacture of a semiconductor laser. This prevents a metal from being taken in the reflectance control film, thus preventing the absorption of light caused by a metal taken in the reflectance control film. It is thus possible to form a reflectance control film on the end faces of semiconductor laser bars while preventing possible degradation due to COD of a semiconductor laser.

2 Claims, 5 Drawing Sheets

METHOD OF MANUFACTURING SEMICONDUCTOR LASER USING END-FACE-PROCESSING JIG

BACKGROUND OF THE INVENTION

1. Field of the Invention

The present invention relates to an end-face-processing jig suitable for use in the formation of a reflectance control film on a light-emitting end face and the opposite end face of a semiconductor laser, and to a method of manufacturing a semiconductor laser employing such an end-face-processing jig.

2. Description of the Background Art

Semiconductor lasers have a reflectance control film formed on their light-emitting end face and the opposite end face thereto for the purpose of efficiently emitting light generated therein and preventing possible degradation due to their oxidation. Semiconductor lasers having a reflectance control film formed on their aforementioned end faces are manufactured in the following manner. Firstly, after a p-type and an n-type layers are formed on the substrate of a compound semiconductor, an electrode is formed on each of the p-type and n-type layers. Then, subsequent cleavage will produce bars each formed of a plurality of semiconductor laser bodies continuous with one another, and such bars (hereinafter referred to as "semiconductor laser bars") and rectangular parallelepipeds (hereinafter referred to as spacers) made of a different material from the bars are arranged alternately and mounted on a jig for fixing them, to thereby form a reflectance control film on the aforementioned end faces (c.f., for example, Japanese Patent Application Laid-open No. 9-83073 and Japanese Patent Publication No. 6-7619).

According to the above conventional techniques, a reflectance control film is formed by deposition of a single-layer film or a multi-layer film of at least two or more layers using any one of sputtering, vacuum evaporation, and CVD (chemical vapor deposition) techniques. In these techniques, however, particles of a material for a reflectance control film have energy, and having that energy they will collide with a jig for fixing semiconductor laser bars and spacers or with the spacers. Although most of the particles colliding with the jig or the spacers are deposited on the jig or the spacers, some may etch the jig or the spacers, so that particles released by the etching from the jig or the spacers may be taken in the reflectance control film formed on the end faces of a semiconductor laser.

If the jig for fixing semiconductor laser bars and spacers is made of, for example, a metal such as stainless steel (SUS), the reflectance control film will take in that metal. If lasing occurs with a metal taken in the reflectance control film, the metal would absorb light and undesirably cause degradation due to catastrophic optical damage (COD), thereby deteriorating the reliability of a semiconductor laser.

SUMMARY OF THE INVENTION

It is an object of the present invention to provide an end-face-processing jig that allows the formation of a reflectance control film on an end face of a semiconductor laser body while preventing possible optical damage and deterioration of a semiconductor laser, and to provide a method of manufacturing a semiconductor laser employing such an end-face-processing jig.

The end-face-processing jig according to the invention fixes a semiconductor laser body in forming a reflectance control film on an end face of the semiconductor laser body for the manufacture of a semiconductor laser. The end-face-processing jig has a window part provided with a window through which an end face of a semiconductor laser body is exposed. At least the window part is made of at least one of an oxide and a nitride.

The end-face-processing jig described above prevents a metal from being taken in a reflectance control film, thus preventing the absorption of light caused by a metal taken in the reflectance control film. This allows the formation of a reflectance control film on the end face of a semiconductor laser body while preventing possible degradation due to catastrophic optical damage (COD) of the semiconductor laser.

The method of manufacturing a semiconductor laser according to the invention includes the step of fixing a semiconductor laser body by an end-face-processing jig and forming a reflectance control film on an end face of the semiconductor laser body, which end face is exposed through a window of the end-face-processing jig. The end-face-processing jig fixes a semiconductor laser body in forming a reflectance control film on an end face of a semiconductor laser body for the manufacture of a semiconductor laser. The end-face-processing jig has a window part provided with a window through which an end face of a semiconductor laser body is exposed. At least the window part is made of at least one of an oxide and a nitride.

The above-described method of manufacturing a semiconductor laser prevents a metal from being taken in the reflectance control film formed on an end face of a semiconductor laser body, thus preventing the absorption of light caused by a metal taken in the reflectance control film. This prevents possible degradation due to COD of a semiconductor laser and produces a high-reliability semiconductor laser.

A method of manufacturing the semiconductor laser according to the invention includes the step of arranging a plurality of semiconductor laser bodies with a spacer interposed between each adjacent two of the semiconductor laser bodies; fixing the plurality of semiconductor laser bodies by an end-face-processing jig; and forming a reflectance control film on end faces of the plurality of semiconductor laser bodies, which end faces are exposed through a window of the end-face-processing jig. The end-face-processing jig fixes a plurality of semiconductor laser bodies in forming a reflectance control film on end faces of the plurality of semiconductor laser bodies for the manufacture of a semiconductor laser. The end-face-processing jig has a window part provided with the window through which end faces of a plurality of semiconductor laser bodies are exposed, and at least the window part is made of at least either an oxide or nitride. The spacers are made of at least either an oxide or a nitride.

Unlike in the case where the window part and the spacers are made of a metal, the above-described method of manufacturing a semiconductor laser can prevent a metal from being taken in the reflectance control film, thus preventing the absorption of light caused by a metal taken in the reflectance control film even if the materials for the window part and the spacers are released by etching. In particular, the above-described method of manufacturing a semiconductor laser more reliably prevents a metal from being taken in the reflectance control film. This allows more reliable prevention of possible degradation due to COD of a semiconductor laser and produces a high-reliability semiconductor laser.

These and other objects, features, aspects and advantages of the present invention will become more apparent from the

DESCRIPTION OF THE PREFERRED EMBODIMENTS

First Preferred Embodiment

Figure 1:
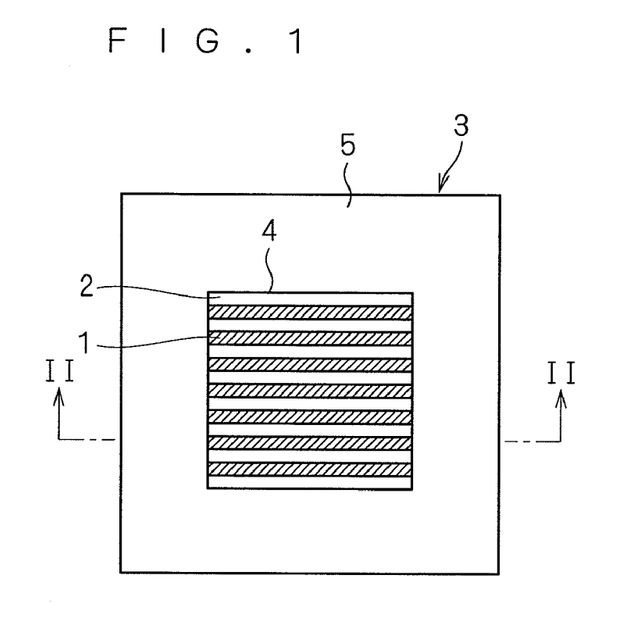
FIG. 1 is a plan view of a semiconductor laser's end-face-processing jig 3 according to a first preferred embodiment of the invention.
Figure 2:
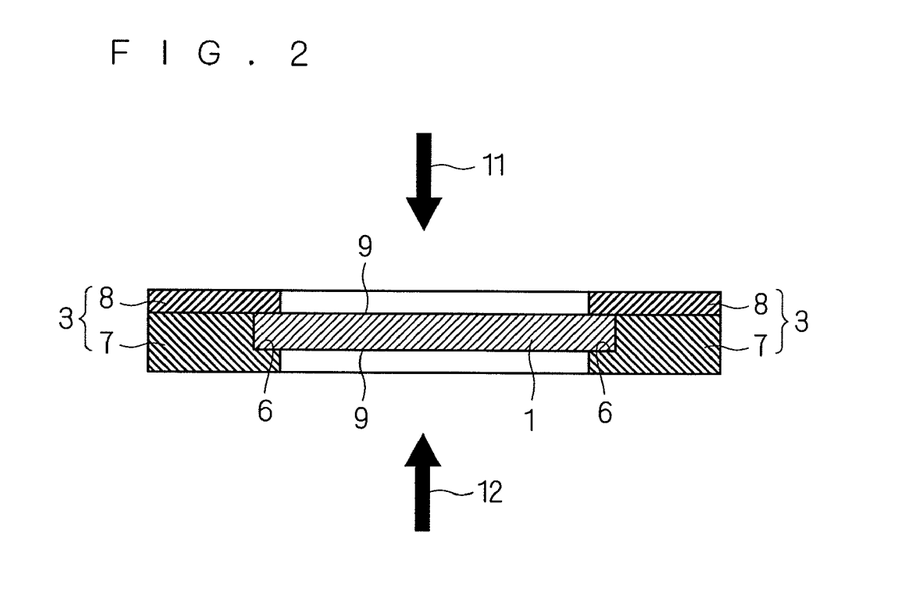
FIG. 2 is a cross-sectional view taken along line II-II in FIG. 1.
Figure 3:
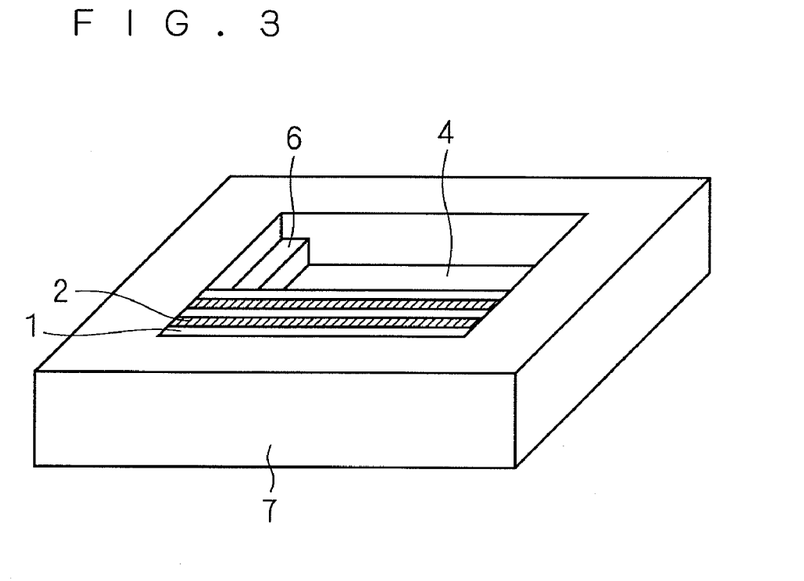
FIG. 3 is a simplified perspective view of a holding jig 7.
Figure 4:
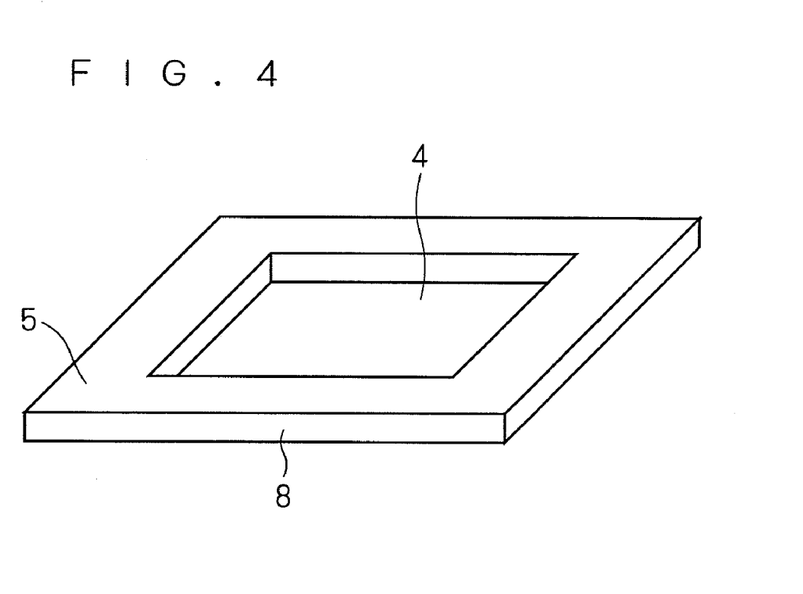
FIG. 4 is a simplified perspective view of a fixing FIG. 8.

FIG. 1 is a plan view of a semiconductor laser's end-face-processing jig 3 according to a first preferred embodiment of the invention. FIG. 2 is a cross-sectional view taken along line II-II in FIG. 1. FIG. 3 is a simplified perspective view of a holding jig 7. FIG. 4 is a simplified perspective view of a fixing jig 8. Referring to FIG. 1, semiconductor laser bars 1 obtained by cleaving a wafer 15 into bars, which will be described later with reference to FIG. 5, and spacers 2 are arranged alternately and fixed to a semiconductor laser's end-face-processing jig (hereinafter referred to simply as an "end-face-processing jig) 3. In other words, a plurality of semiconductor laser bars 1 that are arranged with each spacer 2 interposed between each adjacent two of them and that are fixed to the end-face-processing jig 3 are illustrated in FIG. 1.

Figure 6:
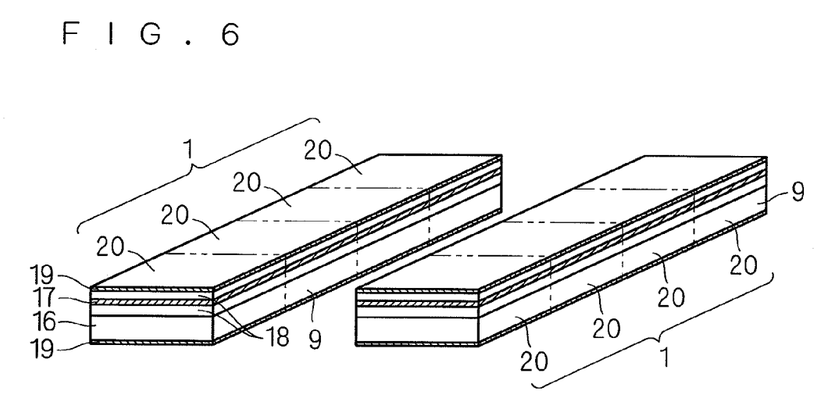
FIG. 6 is a perspective view of semiconductor laser bars 1 obtained by cleaving the wafer 15 in FIG. 5 into a resonator length.

Each semiconductor laser bar 1 is, as will be described later with reference to FIG. 6, formed of a plurality of semiconductor laser bodies 20 arranged contiguous with one another along a given direction into a rectangular parallelepiped. Each spacer 2 is also formed into a rectangular parallelepiped in a similar manner to each semiconductor laser bar 1. Thus, arranging, as shown in FIG. 1, a plurality of semiconductor laser bars 1 along their width with each spacer 2 interposed between each adjacent two of them means that a plurality of semiconductor laser bodies 20 are arranged with each spacer 2 interposed between each adjacent two of them.

Figure 7:
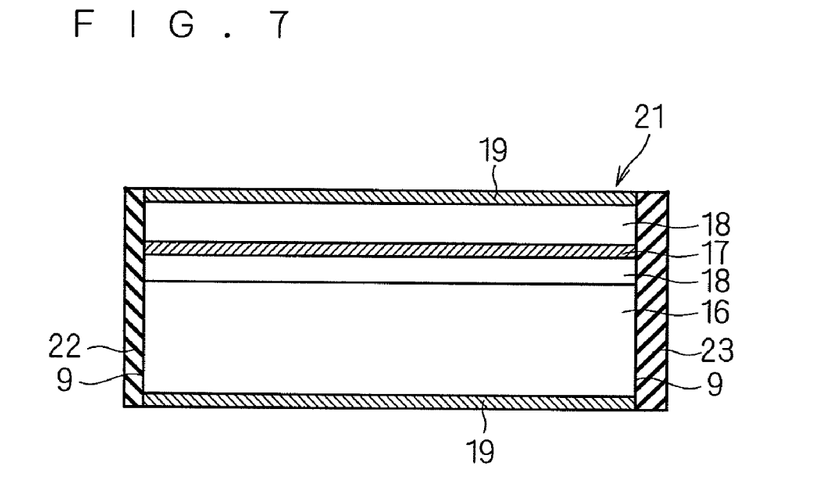
FIG. 7 is a cross-sectional view illustrating a structure of a semiconductor laser 21.

The end-face-processing jig 3 is a jig for fixing the semiconductor laser bodies 20, more specifically the semiconductor laser bars 1, for the manufacture of a semiconductor laser 21 through the formation of reflectance control films 22 and 23, which will be described later with reference to FIG. 7, on end faces 9 of the semiconductor laser bars 1 which are end faces of the semiconductor laser bodies 20. The end-face-processing jig 3 includes a holding jig 7 that has a spot facing part 6, and a fixing jig 8 that holds and fixes the semiconductor laser bars 1 and the spacers 2 in cooperation with the holding jig 7. The holding jig 7 and the fixing jig 8 each are formed into a generally square frame as viewed from one side along their thickness.

As illustrated in FIGS. 2 and 3, the formation of the spot facing part 6 of the holding jig 7 allows the mounting of the semiconductor laser bars 1 and the spacers 2 on the holding jig 7. The end-face-processing jig 3 has a window part 5 provided with a window 4 through which the end faces 9 of the semiconductor laser bodies 20 are exposed. According to the present preferred embodiment, the outer surface of the holding jig 7 and the outer surface of the fixing jig 8 constitute the window part 5. The semiconductor laser bodies 20 are fixed so that their end faces 9 are exposed through the window 4 of the window part 5.

In forming a reflectance control film on the end faces 9 of the semiconductor laser bodies 20, according to the present preferred embodiment, the end-face-processing jig 3 is placed in a film-deposition apparatus so that a material for the reflectance control film is deposited from either a predetermined direction of deposition of the reflectance control film, namely, a first deposition direction 11, or a second deposition direction 12 that is shifted 180 degrees from the first deposition direction 11. The reflectance control film is formed by deposition of a single-layer film or a multi-layer film of at least two or more layers using any one of sputtering, vacuum evaporation, and CVD techniques. The first deposition direction 11 according to the present preferred embodiment is a direction that is perpendicular to and in close proximity to one of the two end faces 9 of the semiconductor laser bodies 20, which end face is partly in contact with the fixing jig 8; and the second deposition direction 12 is a direction that is perpendicular to and in close proximity to the other end face 9 of the semiconductor laser bodies 20, which end face is partly in contact with the holding jig 7.

By placing the semiconductor laser bars 1 and the spacers 2 on the spot facing part 6 of the holding jig 7 so that the end faces 9 of the semiconductor laser bodies 20 are perpendicular to the first and second deposition directions 11 and 12, a preliminary step prior to the formation of a reflectance control film on the end faces 9 of the semiconductor laser bodies 20 is completed.

The holding jig 7 in FIG. 3 and the fixing jig 8 in FIG. 4 are, in practice, configured of screws for fixing both the holding jig 7 and the fixing jig 8 and a number of parts that make up the holding jig 7 and the fixing jig 8 according to the length dimension and the number of semiconductor laser bars 1. However, for easy understanding, the holding jig 7 in FIG. 3 is illustrated in a simplified manner and so is the fixing jig 8 in FIG. 4. The forms of the holding jig 7 and the fixing jig 8 are not limited to those illustrated in FIGS. 3 and 4, and for example, the holding jig 7 and the fixing jig 8 each may be formed into a rectangular frame as viewed from one side along their thickness.

Figure 8:
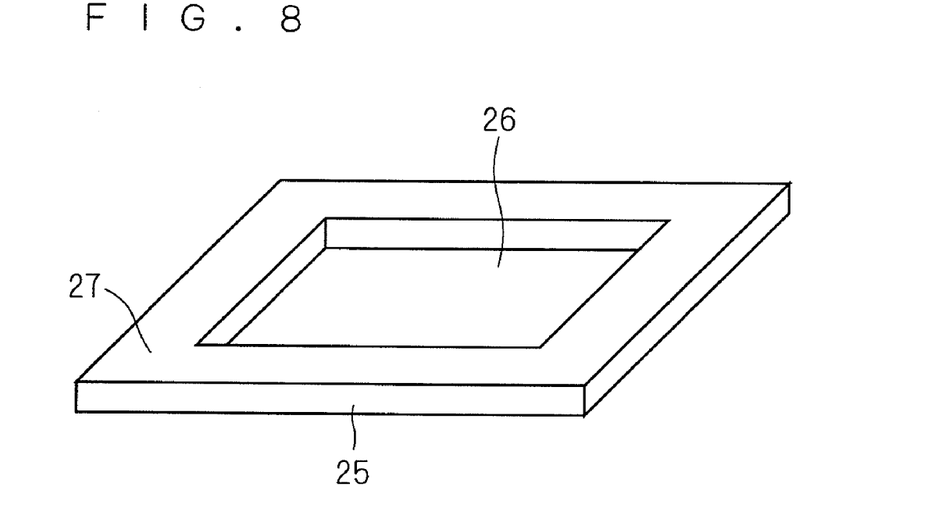
FIG. 8 is a perspective view of a first cover jig 25 of an end-face-processing jig 32.

According to the present preferred embodiment, at least a portion corresponding to the window part 5 of the holding jig 7 and the fixing jig 8 which form the end-face-processing jig 3 is made of at least one of an oxide and a nitride. In an example of this preferred embodiment, the whole end-face-processing jig 3, i.e., the whole of the holding jig 7 and the fixing FIG. 8, is made of at least one of an oxide and a nitride. While the window part 5 of the end-face-processing jig 3 is made of at least one of an oxide and a nitride according to the present preferred embodiment, it should preferably be made of the same material as the reflectance control film formed on the end faces 9 of the semiconductor laser bodies 20, because making the window part 5 of a material of the same type, either oxide or nitride, as but of a different kind from the reflectance control film will affect the reflectance of the reflectance control film.

The reflectance control film according to the present preferred embodiment is made of at least one of an oxide and a nitride. Examples of oxides include aluminum oxide, silicon oxide, tantalum oxide, titanium oxide, magnesium oxide, and niobium oxide. Examples of nitrides include aluminum nitride and silicon nitride. The reflectance control film is formed by deposition of a single layer of either an oxide or a nitride as given above, or a multiple layer of at least two or more such layers. The end-face-processing jig 3 according to the present preferred embodiment is made of the same material as the aforementioned reflectance control film.

As previously described, the end-face-processing jig 3 according to the present preferred embodiment fixes the semiconductor laser bodies 20 in such a manner that the end faces 9 are exposed through the window 4 of the window part 5. In this condition, a reflectance control film is formed on the end faces 9 of the semiconductor laser bodies 20, which produces a semiconductor laser. In forming a reflectance control film by deposition of a material for the reflectance control film from either the first or second deposition direction 11 or 12 on the end faces 9 of the semiconductor laser bodies 20, if the material for the reflectance control film is deposited on the window part 5 of the end-face-processing jig 3 and etches the window part 5, the material for the window part 5 would be released by the etching and taken in the reflectance control film. If the window part 5 of the end-face-processing jig 3 is made of a metal, the metal would be taken in the reflectance control film and absorb light, causing degradation due to COD. However, since the window part 5 of the end-face-processing jig 3 according to the present preferred embodiment is made of at least one of an oxide and a nitride, even if the material for the window part 5 is taken in the reflectance control film, only at least one of an oxide and a nitride will be taken in the reflectance control film.

This prevents the reflectance control film from taking in a metal and thus eliminates the possibility of light absorption caused by a metal taken in the reflectance control film, thereby allowing the formation of a reflectance control film on the end faces 9 of the semiconductor laser bodies 20 while preventing possible degradation due to COD of a semiconductor laser.

Although the reflectance control film may be formed by any one of sputtering, vacuum evaporation, and CVD techniques as previously described, the end-face-processing jig 3 according to the present preferred embodiment can most effectively achieve the above-described effect when a reflectance control film is formed by sputtering in which case energy of the particles released as a material for the reflectance control film is high.

Besides, the end-face-processing jig 3 according to the present preferred embodiment can also achieve the same effect as in the aforementioned case of forming a reflectance control film, when contaminants, moisture, natural oxides, and the like are removed from the end faces 9 of the semiconductor laser bodies 20 in a plasma state containing a rare gas, a nitrogen gas, an oxygen gas, or a mixed gas thereof, prior to the formation of a reflectance control film using the aforementioned techniques.

Figure 5:
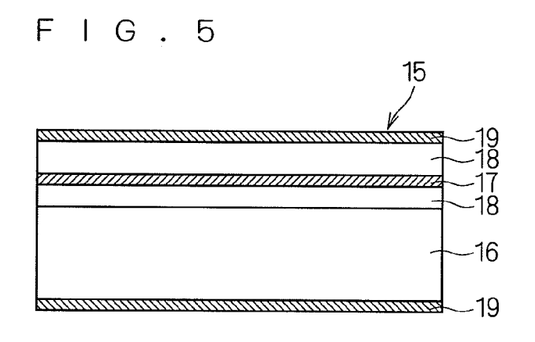
FIG. 5 is a cross-sectional view illustrating a structure of a wafer 15 in the stage after a GaAs substrate has gone through an epitaxial-growth step, an insulation-film forming step, and a metal-electrode forming step.

FIG. 5 is a cross-sectional view illustrating a structure of a wafer 15 in the stage after a GaAs substrate has gone through an epitaxial-growth step, an insulation-film forming step, and a metal-electrode forming step. FIG. 6 is a perspective view of semiconductor laser bars 1 obtained by cleaving the wafer 15 in FIG. 5 into a resonator length. FIG. 7 is a cross-sectional view illustrating a structure of a semiconductor laser 21.

The semiconductor laser bodies 20, which form the semiconductor laser 21, are produced by epitaxial growth on a substrate, such as a gallium arsenide (GaAs), an indium phosphide (InP), or a gallium nitride (GaN) substrate, thereby forming an area where lasing occurs. The present preferred embodiment describes a method of manufacturing a semiconductor laser with an oscillation wavelength of 650 nm, using a GaAs substrate. It is noted herein that the substrate and the oscillation wavelength of a semiconductor laser are not limited to those described above.

The wafer 15 including a plurality of semiconductor laser bodies 20 is produced by crystal growth of an active layer 17 and a cladding layer 18 on a GaAs substrate 16 using the epitaxial growth technique, and subsequent formation of an electrode 19 on both crystal and substrate sides. The wafer 15 produced in this way is cleaved into a resonator length, thereby producing semiconductor laser bars 1 each formed of a plurality of semiconductor laser bodies 20 continuous with one another. Then, on the end faces 9 formed by the cleavage, a reflectance control film is formed by any one of various deposition techniques, such as sputtering, vacuum evaporation, and CVD, using the aforementioned end-face-processing jig 3.

In the semiconductor laser 21 requiring high power, a reflectance control film with low reflectance (hereinafter referred to as a "first reflectance control film") 22 is formed on the laser-emitting end face 9, and a reflectance control film with high reflectance (hereinafter referred to as a "second reflectance control film") 23 is formed on the opposite end face 9. The reflectance of the first reflectance control film 22 is not simply low and must be decided according to the characteristics required for a semiconductor laser. High-power semiconductor lasers will choose the first reflectance control film 22 having a reflectance of about 3 to 7% and, in the case where some kinds of measures should be taken for return light, a reflectance of about 7 to 10%. The second reflectance control film should have a reflectance of 60% or more, preferably 80% or more. As illustrated in FIG. 7, after the formation of the first and second reflectance control films 22 and 23 on the end faces 9, each semiconductor laser bar 1 is divided into individual chips, i.e., individual semiconductor laser bodies 20, which produces a semiconductor laser 21.

In the method of manufacturing a semiconductor laser according to the present preferred embodiment, the semiconductor laser bodies 20 are fixed by the end-face-processing jig 3 having the window part 5 formed of at least one of an oxide and a nitride, and the first and second reflectance control films 22 and 23 are formed on the end faces 9 of the semiconductor laser bodies 20, which end faces are exposed through the window 4 of the window part 5. This prevents a metal from being taken in the first and second reflectance control films 22 and 23 formed on the end faces 9 of the semiconductor laser bodies 20 and eliminates the possibility of light absorption caused by a metal taken in the first and second reflectance control films 22 and 23, thus allowing the production of a high-reliability semiconductor laser 21 while preventing possible degradation due to COD of the semiconductor laser 21.

Second Preferred Embodiment

Next described is an end-face-processing jig and a method of manufacturing a semiconductor laser using the end-face-processing jig according to a second preferred embodiment of the invention. The steps in the production of a semiconductor laser bar according to the present preferred embodiment are identical to those previously described in the first preferred embodiment, so that corresponding parts are designated by the same reference numerals and redundant descriptions of the common parts to those in the first preferred embodiment are omitted herein.

Although the first preferred embodiment has described the end-face-processing jig 3 made of either an oxide or a nitride, oxide and nitride are difficult to process as compared to metal and cause an increase in manufacturing cost. Thus, the holding jig 7 having in particular the spot facing part 6 should desirably be made of a metal such as stainless used steel (SUS).

An end-face-processing jig 32 according to the present preferred embodiment is made in view of the aforementioned processability and cost of end-face-processing jigs and is configured such that, in depositing a reflectance control film on the end faces of the semiconductor laser bars 1 from either the first or second deposition direction 11 or 12, cover jigs made of either an oxide or a nitride are mounted on the end-face-processing jig 3 described with reference to FIGS. 1 to 4 in the first preferred embodiment, at the sites where the reflectance control film is deposited. In other words, the end-face-processing jig 32 according to the present preferred embodiment includes a jig body 31 that is configured identical to the end-face-processing jig 3 of the first preferred embodiment, and first and second cover jigs 25 and 28.

Figure 9:
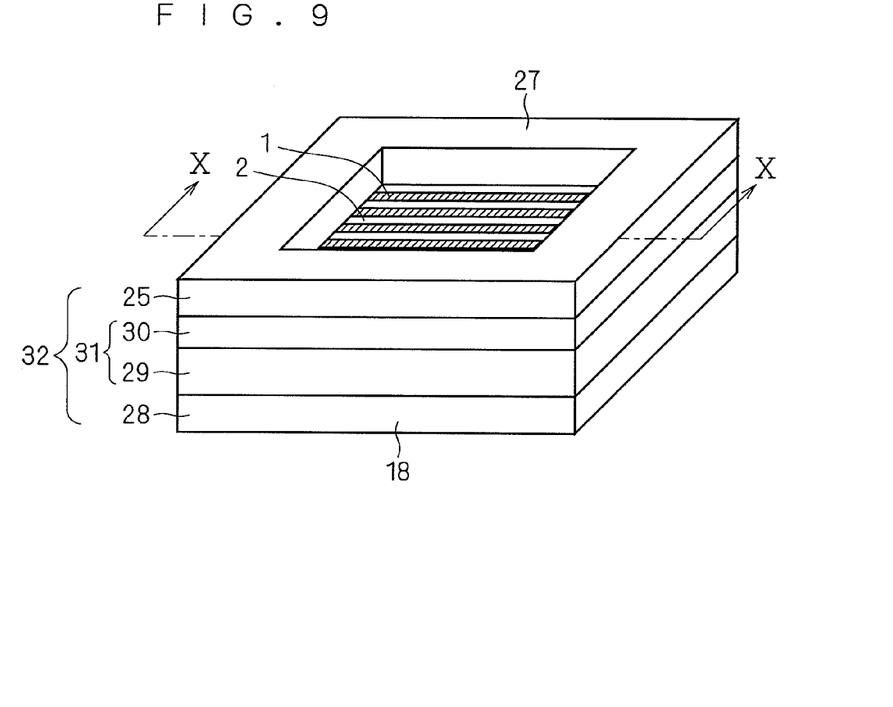
FIG. 9 is a perspective view illustrating first and second cover jigs 25 and 28 mounted on a holding jig 29 and a fixing jig 30.
Figure 10:
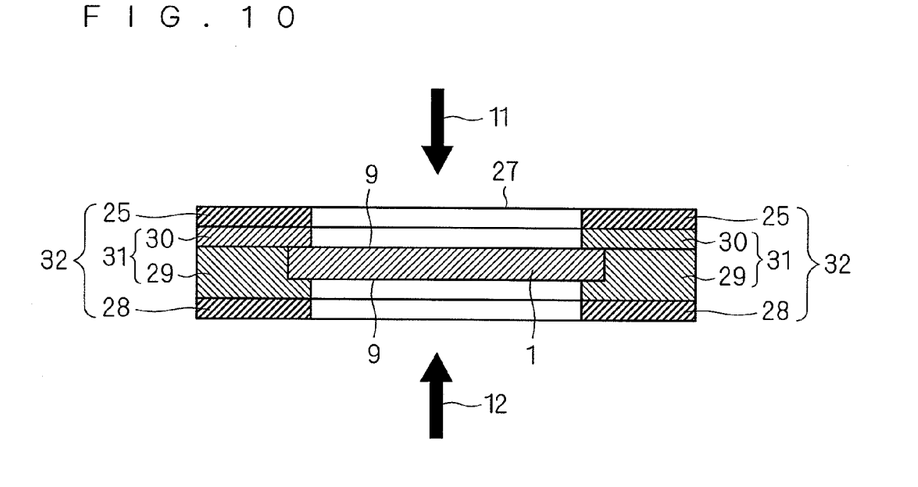
FIG. 10 is a cross-sectional view taken along line X-X in FIG. 9.

FIG. 8 is a perspective view of the first cover jig 25 of the end-face-processing jig 32. FIG. 9 is a perspective view illustrating the first and second cover jigs 25 and 28 mounted on a holding jig 29 and a fixing jig 30. FIG. 10 is a cross-sectional view taken along line X-X in FIG. 9.

While the jig body 31 according to the present preferred embodiment is configured identical to the end-face-processing jig 3 of the aforementioned first preferred embodiment, the holding jig 29 and the fixing jig 30, which form the jig body 31, are made of a metal. The first and second cover jigs 25 and 28 each are formed into a generally square frame as viewed from one side along their thickness. The first and second cover jigs 25 and 28, as a whole, are larger in dimension than the jig body 31 which corresponds to the end-face-processing jig 3 of the first preferred embodiment, and their window 26 is made to dimensions equal to or smaller than those of the window 4 of the jig body 31. Since, as illustrated in FIG. 9, the first and second cover jigs 25 and 28 only needs to cover the jig body 31 and does not need to worry about holding the semiconductor laser bars 1 and the spacers 2, it can be made by just boring a hole in a plate, or the like. Thus, configuring the end-face-processing jig 32 with the first and second cover jigs 25 and 28 will resolve the aforementioned problems of difficulty in processing and increased manufacturing cost.

The first and second cover jigs 25 and 28 are made of at least one of an oxide and a nitride. Thus, in the formation of a reflectance control film by collision of particles of a material for the reflectance control film from either the predetermined first deposition direction 11 or the second deposition direction 12 shifted 180 degrees from the first deposition direction 11, even if the holding jig 29 and the fixing jig 30 are made of a metal such as SUS, the material for the reflectance control film will not be deposited on the SUS, which prevents the SUS from being taken in the reflectance control film. Preventing in this way a metallic material such as SUS from being taken in the reflectance control film allows the production of a high-reliability semiconductor laser. As previously described in the first preferred embodiment, the first and second cover jigs 25 and 28 should preferably be made of the same material as the reflectance control films 22 and 23 formed on the end faces 9.

Since both the holding jig 29 and the fixing jig 30 of the present preferred embodiment are made of a metal, the two cover jigs 25 and 28 are provided to cover the holding jig 29 and the fixing jig 30, respectively. The number of cover jigs is, however, not limited to two and may be decided according to the materials for the holding jig 29 and the fixing jig 30. For instance, when, out of the holding jig 29 or the holding 30, only the fixing jig 30 is made of at least one of an oxide and a nitride, the first cover jig 25 for covering the fixing jig 30 is unnecessary, while when only the holding jig 29 is made of at least one of an oxide and a nitride, the second cover jig 28 for covering the holding jig 29 is unnecessary.

According to the present preferred embodiment, the end-face-processing jig 32 includes the jig body 31 and the cover jigs 25 and 28. The semiconductor laser bodies 20 are fixed by the jig body 31, and the window 26, through which the end faces 9 of the semiconductor laser bodies 20 are exposed, is formed in a window part 27 of the cover jigs 25 and 28 that cover the jig body 31. This configuration allows the jig body 31 to be made of a different material from the window part 27, so that the jig body 31 can be made of an easy-to-process, low-cost material such as a metal. Since the cover jigs 25 and 28 are made in a simple way, for example by simple processing such as just boring a hole in a plate, they can be manufactured with ease and at a low price. The end-face-processing jig 32 can thus be manufactured with easier and at a lower price than when the whole of the end-face-processing jig 32 is made of at least one of an oxide and a nitride.

Third Preferred Embodiment

Next described is an end-face-processing jig and a method of manufacturing a semiconductor laser using the end-face-processing jig according to a third preferred embodiment of the invention. Both the steps in the production of a semiconductor laser bar and the end-face-processing jig according to the present preferred embodiment are identical to those previously described in the first preferred embodiment, so that corresponding parts are designated by the same reference numerals and redundant descriptions of the common parts to those in the first preferred embodiment are omitted herein.

In forming a reflectance control film, the material for the reflectance control films 22 and 23 is deposited not only on the end-face-processing jig 3 but also on the spacers 2. Thus, if the spacers 2 are made of a metal, the spacers 2 would be etched by the deposition of the material for the reflectance control films 22 and 23, which in some cases can cause metal particles released by the etching from the spacers 2 to be taken in the reflectance control films 22 and 23.

The present preferred embodiment thus provides the spacers 2 of at least one of an oxide and a nitride, thereby further preventing metal particles from being taken in the reflectance control films 22 and 23. This allows the production of a high-reliability semiconductor laser.

As previously described in the first and second preferred embodiments, the spacers 2 should preferably be made of the same material as the reflectance control films 22 and 23 formed on the end faces 9.

Alternatively, the end-face-processing jig 3 according to the present preferred embodiment may be provided with the cover jigs 25 and 28 as previously described in the second preferred embodiment. With such a configuration, the same effects as previously described in the second preferred embodiment can be achieved.

In the method of manufacturing a semiconductor laser according to the present preferred embodiment, in fixing a plurality of semiconductor laser bodies 20 by the end-face-processing jig 3 having the window part 5 of at least one of an oxide and a nitride, a spacer 2 of at least one of an oxide and a nitride is interposed between each adjacent two of the semiconductor laser bodies 20. In this condition, the reflectance control films 22 and 23 are formed on the end faces 9 of each of the semiconductor laser bodies 20, which end faces are exposed through the window 4 of the window part 5 of the end-face-processing jig 3.

Since the window part 5 of the end-face-processing jig 3 and the spacers 2 are made of at least one of an oxide and a nitride, even if the materials for the window part 5 and the spacers 2 are released by etching, no metal would be taken in the reflectance control films 22 and 23, unlike in the case where the window part 5 and the spacers 2 are made of a metal. This prevents the absorption of light caused by a metal taken in the reflectance control films 22 and 23. In particular, according to the preferred embodiment, not only the window part 5 but also the spacers 2 are made of at least one of an oxide and a nitride, which more reliably prevents a metal from being taken in the reflectance control films 22 and 23. This results in more reliable prevention of possible degradation due to COD of a semiconductor laser, thus producing a high-reliability semiconductor laser.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor laser comprising:
    fixing a semiconductor laser body in an end-face-processing jig, the end-face-processing jig including a metal jig body that fixes the semiconductor laser body in the jig and a cover jig including a window through which an end face of the semiconductor laser body is exposed when the semiconductor laser body is fixed in the end-face-processing jig, the cover jig being made of at least one of an oxide and a nitride and covering the jig body; and
    forming a reflectance control film on the end face of the semiconductor laser body exposed by the window of the cover jig.

2. A method of manufacturing a semiconductor laser comprising:
    arranging a plurality of semiconductor laser bodies and spacers with a spacer interposed between each closest pair of the semiconductor laser bodies;
    fixing the plurality of semiconductor laser bodies and spacers in an end-face-processing jig, the end-face-processing jig including a metal jig body that fixes the semiconductor laser bodies and spacers in the jig and a cover jig including a window through which an end face of the semiconductor laser bodies are exposed when the semiconductor laser bodies are fixed in the end-face-processing jig, the cover jig being made of at least one of an oxide and a nitride and covering the jig body; and
    forming a reflectance control film on the end faces of the plurality of semiconductor laser bodies exposed by the window of the cover jig.

* * * * *